United States Patent [19]

Ishimori et al.

[11] Patent Number: 5,351,259
[45] Date of Patent: Sep. 27, 1994

[54] SEMICONDUCTOR LASER-PUMPED SOLID-STATE LASER WITH PLURAL BEAM OUTPUT

[75] Inventors: Akira Ishimori; Takashi Yamamoto; Tetsuo Kojima, all of Amagasaki, Japan

[73] Assignee: Mitsubishi Denki Kabushiki Kaisha, Tokyo, Japan

[21] Appl. No.: 965,716

[22] Filed: Oct. 23, 1992

[30] Foreign Application Priority Data

Oct. 24, 1991 [JP] Japan ................... 3-277547
Oct. 29, 1991 [JP] Japan ................... 3-283188

[51] Int. Cl.[5] ............... H01S 3/07; H01S 3/094; H01S 3/16
[52] U.S. Cl. ................... 372/75; 372/71; 372/97; 372/101
[58] Field of Search ............ 372/75, 99, 71, 72, 372/97, 101

[56] References Cited

U.S. PATENT DOCUMENTS

| | | | |
|---|---|---|---|
| 4,894,839 | 1/1990 | Baer | 372/75 |
| 4,901,330 | 2/1990 | Wolfram et al. | 372/75 |
| 4,924,474 | 5/1990 | Yagi et al. | 372/75 |
| 5,123,025 | 6/1992 | Papuchon et al. | |
| 5,243,619 | 9/1993 | Albers et al. | 372/97 |

FOREIGN PATENT DOCUMENTS

| | | |
|---|---|---|
| 0486175 | 5/1991 | European Pat. Off. . |
| 0432009 | 6/1991 | European Pat. Off. . |
| WO90/13158 | 11/1990 | PCT Int'l Appl. . |
| WO91/05382 | 4/1991 | PCT Int'l Appl. . |
| 2215906 | 9/1989 | United Kingdom . |
| 2241109 | 8/1991 | United Kingdom . |

OTHER PUBLICATIONS

A. Ishimori et al., "Pumping Configuration Without Focusing Lenses for a Small Sized Diode-Pumped Nd:YAG Slab Laser", *Opt. Let.*, vol. 17, No. 1, Jan. 1992, pp. 40-42.

Michio Oka et al., "Laser-Diode-Pumped 2×2 Phase-Locked Nd:YAG Laser Arrays", *Technical Digest of Cleo '91*, May 1991, pp. 40-41.

C. D. Nabors et al., "High-Power Nd:YAG Microchip Laser Arrays", *Technical Digest of Advanced Solid-State Lasers Topical Meeting*, TuC5-1, 1992, pp. 189-191.

*Primary Examiner*—Rodney B. Bovernick
*Assistant Examiner*—Robert McNutt
*Attorney, Agent, or Firm*—Burns, Doane, Swecker & Mathis

[57] ABSTRACT

A semiconductor-laser-pumped solid-state laser apparatus having a semiconductor laser device, a solid state laser medium, and laser resonators. The semiconductor laser device has a plurality of emission points which are arranged on a straight line and from which pump light is generated. The laser resonators are disposed in correspondence with the emission points. A plurality of solid state laser beams can be generated by using one solid state laser medium.

11 Claims, 7 Drawing Sheets

SEMICONDUCTOR LASER-PUMPED SOLID-STATE LASER WITH PLURAL BEAM OUTPUT

BACKGROUND OF THE INVENTION

1. Field of the Invention

This invention relates to a semiconductor-laser-pumped solid-state laser and, more particularly, to a semiconductor-laser-pumped solid-state laser capable of generating a plurality of beams of laser light.

2. Description of the Related Art

FIG. 19 and 20 are a schematic plan view and a schematic side view of a semiconductor-laser-pumped solid-state laser apparatus in which a semiconductor laser element is disposed close to a laser medium having a small sectional area, and which is known, for example, as one described in "Laser Kenkyu" Vol. 18, No. 8 (1990) pp. 622–627. In the semiconductor-laser-pumped solid-state laser apparatus shown in FIGS. 19 and 20, a semiconductor laser device 1 generates pump light 2 which enters a solid state laser medium 3. For example, the solid state laser medium 3 is formed of a Nd:YAG ($Y_{3-x}Nd_xAl_5O_{12}$) crystal having a length of 5 mm, a width of 2 mm and a thickness of 0.5 mm and having a rectangular cross-section. A coating which is nonreflective with respect to pump light 2 but is totally reflective with respect to laser light 4 is formed on a pump light incidence end surface 3a of the solid state laser medium 3, while a coating which is non-reflective with respect to laser light 4 is formed on an end surface 3b of the solid state laser medium 3. A partial reflection mirror 5 is disposed so as to face the end surface 3b of the solid state laser medium 3.

The operation of this semiconductor-laser-pumped solid-state laser apparatus will be described below. Pump light 2 enters the solid state laser medium 3 through the pump light incidence end surface 3a. Pump light 2 in the perpendicular direction is repeatedly reflected by upper and lower surfaces 3c of the solid state laser medium 3 and is absorbed by the solid state laser medium 3 while being confined in this medium. The solid state laser medium 3 is thereby pumped effectively. In the meantime, there is no need to confine the pump light 2 in the parallel direction because the beam divergence in this direction is comparatively small. Light spreading out perpendicularly to the semiconductor laser active layer is reflected by the upper and lower surfaces 3c, so that the light pump region in the solid laser medium 3 has a size of about 0.5 mm in each of the perpendicular and parallel directions with respect to the semiconductor laser active layer. A stable laser resonator is formed by the pump light incidence end surface 3a and the partial reflection mirror 5. For example, if the pump light incidence surface 3a is flat, the radius of curvature of the partial reflection mirror 5 is 2500 mm, and the length of the resonator is 10 mm, then a beam of laser light 4 having a diameter of about 0.35 mm in a fundamental mode (Gaussian mode) is oscillated.

In the conventional semiconductor-laser-pumped solid-state laser apparatus, however, only one laser beam can be obtained from one laser device, and it is necessary to prepare a plurality of laser devices if a plurality of independent laser beams are required.

SUMMARY OF THE INVENTION

In view of this problem, an object of the present invention is to provide a semiconductor-laser-pumped solid-state laser apparatus capable of independently generating a plurality of laser beams from one laser device.

To achieve this object, according to one aspect of the present invention, there is provided a semiconductor-laser-pumped solid-state laser apparatus comprising a semiconductor laser device for generating pump light, a solid-state thin plate laser medium pumped by the pump light disposed close to said semiconductor laser device, said laser medium efficiently confining the pump light therein by repeated reflection of the pump light on both an upper and lower surface of said laser medium and laser resonator means having a pair of reflecting mirrors and/or coatings facing each other with the solid state laser medium interposed therebetween, the laser resonator means being for emitting laser light. The semiconductor laser device has a plurality of emission points which are arranged on a straight line and from which the pump light is generated, and the laser resonator means is disposed in correspondence with the emission points.

According to another aspect of the present invention, there is provided a semiconductor-laser-pumped solid-state laser apparatus comprising a semiconductor laser device for generating pump light, a solid state laser medium in which the pump light is confined by internal reflection and which is pumped by the pump light, and laser resonator means having a pair of reflecting mirrors and/or coatings facing each other with the solid state laser medium interposed therebetween, the laser resonator means being for emitting laser light. A plurality of microlenses for emitting a plurality of beams of the laser light are provided in the resonator means.

DESCRIPTION OF THE PREFERRED EMBODIMENTS

Example 1

Figure 1:
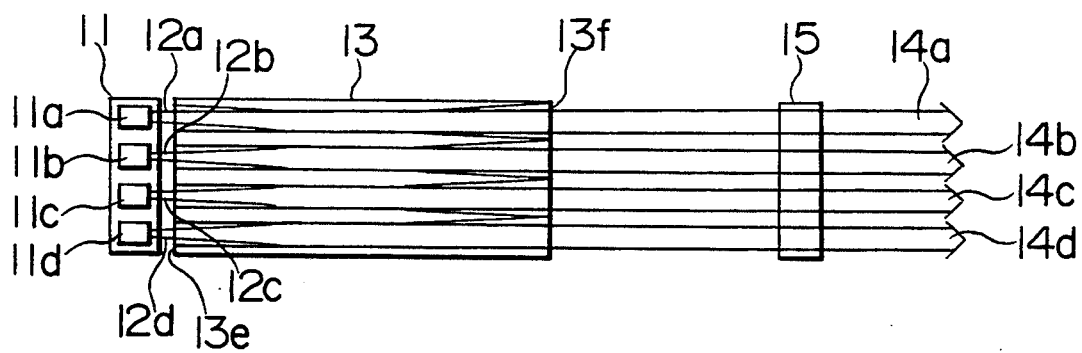
FIG. 1 is a schematic plan view of a semiconductor-laser-pumped solid-state laser apparatus in accordance with Example 1 of the present invention.
Figure 2:
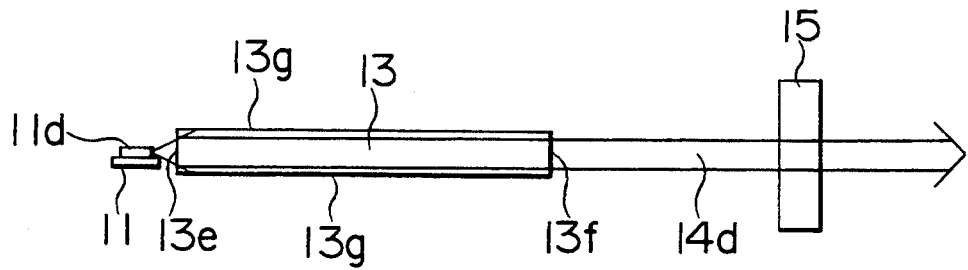
FIG. 2 is a schematic side view of the laser apparatus shown in FIG. 1.

FIGS. 1 and 2 are a schematic plan view and a schematic side view of a semiconductor-laser-pumped solid-state laser apparatus in accordance with Example 1 of the present invention. As shown in FIG. 1, a semiconductor laser device 11 for generating a plurality of pump light beams 12a to 12d has four emission points 11a to 11d arranged at, for example, a 0.5 mm pitch in a straight line. A solid state laser medium 13 is formed of, for example, a Nd:YAG ($Y_{3-x}Nd_xAl_5O_{12}$) crystal having a length of 5 mm, a width of 2 mm and a thickness of 0.5 mm and having a rectangular cross-section. Laser beams 14a, 14b, 14c, and 14d are output from the solid state laser medium 13. A coating which is nonreflective with respect to pump light beams 12a to 12d but which is totally reflective with respect to laser beams 14a to 14d is formed on a pump light incidence end surface 13e of the solid state laser medium 13, while a coating which is non-reflective with respect to laser beams 14a to 14d is formed on an end surface 13f of the solid state laser medium 13. A partial reflection mirror 15 is disposed so as to face the end surface 13f of the solid state laser medium 13.

The operation of this semiconductor-laser-pumped solid-state laser apparatus will be described below. Pump light beams 12a to 12d generated from the semiconductor laser device 11 enter the solid state laser medium 13 through the pump light incidence end surface 13e. Pump light beams 12 are repeatedly reflected in the solid state laser medium 13 by upper end lower surfaces 13g of the same and are absorbed by the solid state laser medium 13 while being confined in this medium. The solid state laser medium 13 is thereby pumped effectively. In the meantime, there is no need to confine the pump light beams 12 in the parallel direction because the beam divergence in this direction is comparatively small. Light spreading out perpendicularly to the semiconductor laser active layer is reflected by the upper and lower surfaces 13g, so that four light excitation regions having a size of about 0.5 mm in each of the perpendicular and parallel directions with respect to the semiconductor laser active layer are formed in the solid state laser medium 13. If the thermal lens effect provided in each excitation region is evaluated by a method described on page 357 of "Solid State Laser Engineering" written by W. Koechner, the focal length is 2.5 m when the semiconductor laser output is 200 mw. If each of the pump light incidence end surface 13e and the partial reflection mirror 15 is flat and if the resonator length is 10 mm, four laser beams 14a to 14d in a fundamental mode (Gaussian mode) having a diameter of about 0.35 mm are oscillated.

In this example, semiconductor laser device 11 has a plurality of emission points 11a to 11d. Semiconductor laser device 11, however, may be a semiconductor laser array in which emission points are arranged straight in one row, or a group of semiconductor laser devices arranged along a straight line.

Example 2

Figure 3:
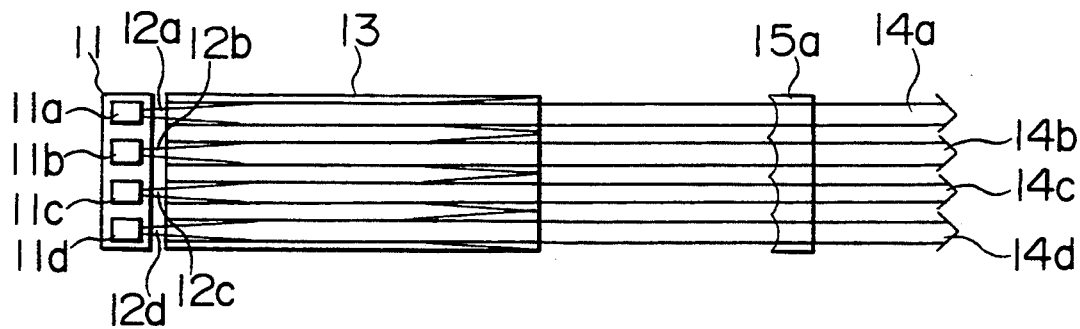
FIG. 3 is a schematic plan view of a semiconductor-laser-pumped solid-state laser apparatus in accordance with Example 2 of the present invention.

FIG. 3 shows another example of the semiconductor-laser-pumped solid-state laser apparatus of the present invention in which a partial reflection mirror 15a is sectioned into four portions in correspondence with four laser beams 14a to 14d, and in which a surface of each portion is curved so as to form a one-dimensional array of substantially four concave mirrors. In Example 1, there is a risk of a change in the shape of laser beams 14a to 14d or failure to completely separate four laser beams 14a to 14d due to a change in thermal lens conditions of the semiconductor laser medium 13 depending upon the output from the semiconductor laser device 11. In this example, the reflecting mirror 15a is formed with far smaller curvature (e.g., 300 mm in terms of radius of curvature) than the focal length in the thermal lens effect to ensure that the four laser beams 14a to 14d can be generated with stability in a fundamental mode by being completely separated.

Example 3

Figure 4:
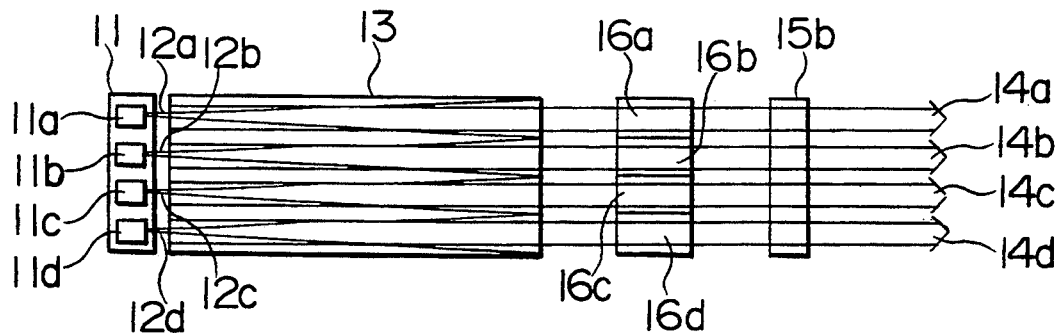
FIG. 4 is a schematic plan view of a semiconductor-laser-pumped solid-state laser apparatus in accordance with Example 3 of the present invention.

FIG. 4 shows another example of the semiconductor-laser-pumped solid-state laser apparatus of the present invention in which a partial reflection mirror 15b is formed as a flat mirror, and in which rod-type microlenses 16a to 16d for forming laser beams 14a to 14d into a certain shape are disposed in correspondence with laser beams 14a to 14d. In this example, four stable laser beams 14a to 14d in a fundamental mode can be easily obtained without requiring the troublesome operation of finely working the partial reflection mirror 15a of Example 2.

Example 4

Figure 5:
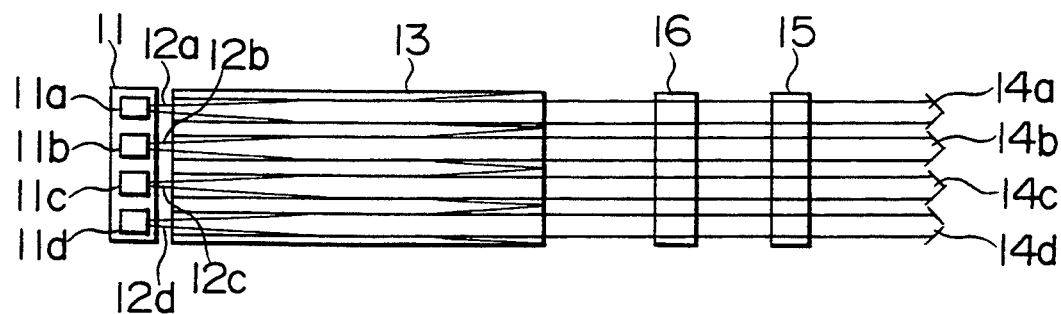
FIG. 5 is a schematic plan view of a semiconductor-laser-pumped solid-state laser apparatus in accordance with Example 4 of the present invention.

FIG. 5 shows a further example of the semiconductor-laser-pumped solid-state laser apparatus of the present invention in which a one-dimensional flat-plate microlens 16 formed in accordance with the pitch of four laser beams 14a to 14d is disposed in resonators. The flat-plate microlens 16 is previously formed with accuracy, so that four stable laser beams 14a to 14d in a fundamental mode can be generated by a very easy optical axis adjustment operation.

Example 5

Figure 6:
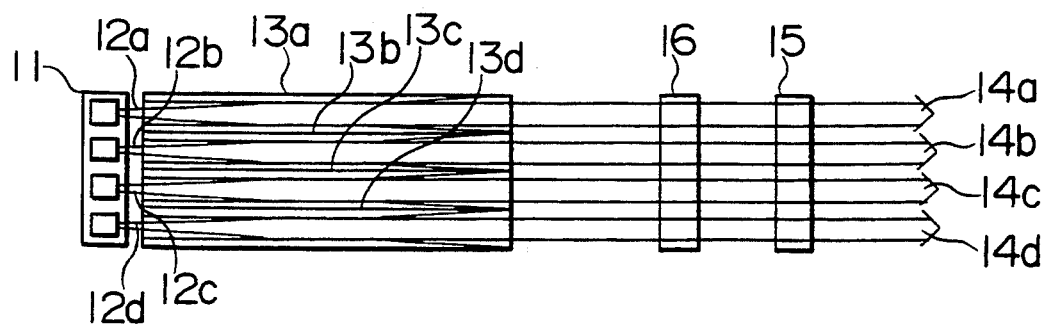
FIG. 6 is a schematic plan view of a semiconductor-laser-pumped solid-state laser apparatus in accordance with Example 5 of the present invention.

FIG. 6 shows a further example of the semiconductor-laser-pumped solid-state laser apparatus of the present invention which is constructed in such a manner that solid state laser mediums each in the form of a prism are integrally bonded together and used in the arrangement of Example 4. By this construction, laser beams can be separated more completely between adjacent laser resonators, so the interference between the resonators is eliminated.

Figure 7:
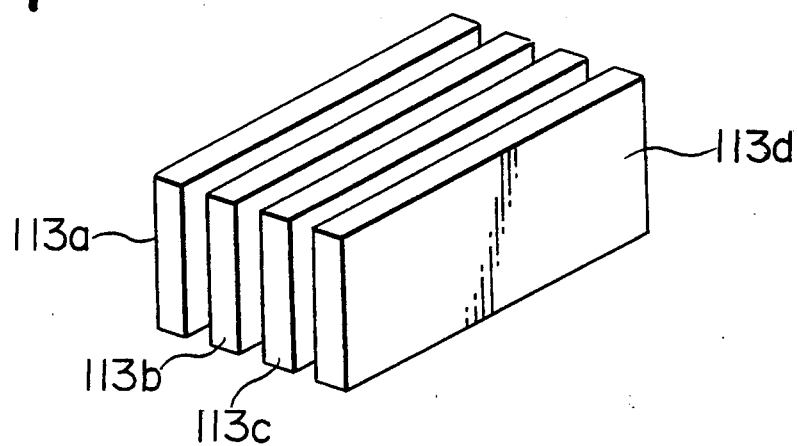
FIG. 7 is a perspective view of solid state laser medium members in the form of a thin flat plate.
Figure 8:
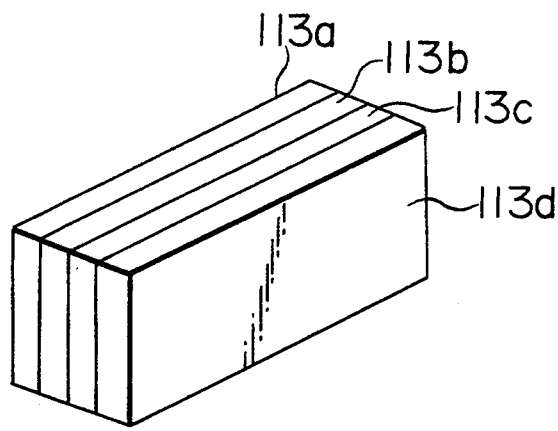
FIG. 8 is a perspective view of a state in which the solid state laser medium members shown in FIG. 7 are bonded together.
Figure 9:
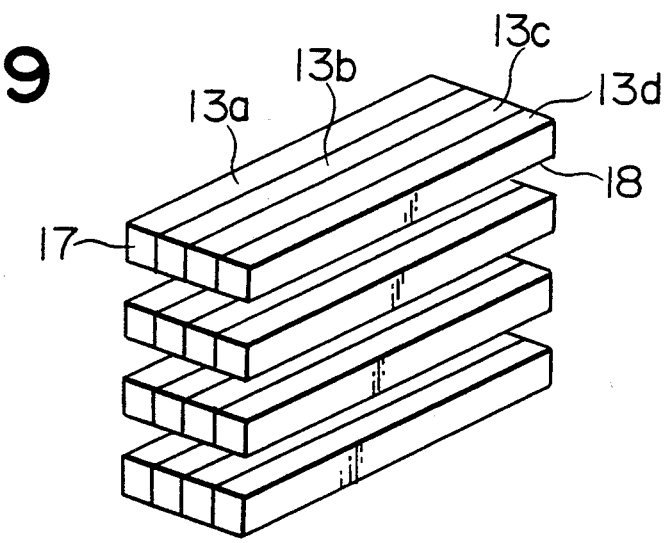
FIG. 9 is a perspective view of a state in which the solid state laser medium members shown in FIG. 8 are cut along planes perpendicular to the bonded surfaces.

This solid state laser medium member can be easily manufactured by a process shown in FIGS. 7 to 9. That is, thin solid state laser mediums 113a to 113d such as those shown in FIG. 7 are bonded by an optical adhesive, as shown in FIG. 8 and are cut along planes perpendicular to the bonded surfaces, as shown in FIG. 9. End surfaces 17 and 18 are thereafter polished, and a reflective coating, a nonreflective coating or the like is formed on the end surfaces 17.

Example 6

Figure 10:
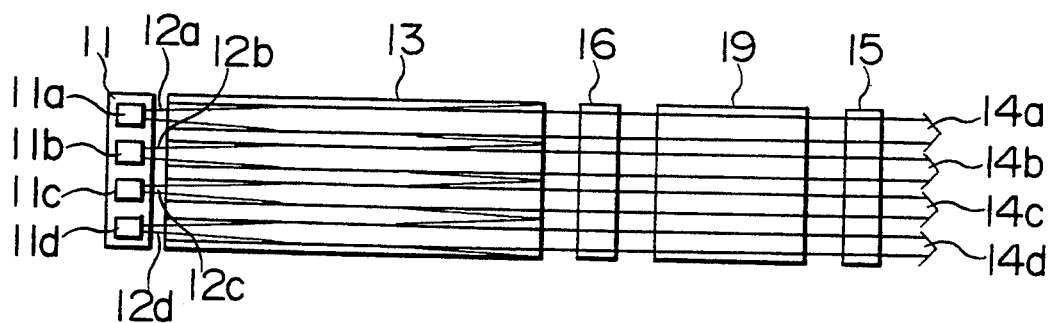
FIG. 10 is a schematic plan view of a semiconductor-laser-pumped solid-state laser apparatus in accordance with Example 6 of the present invention.

FIG. 10 shows a further example of the semiconductor-laser-pumped solid-state laser apparatus of the present invention in which a non-linear optical element 19, e.g., a KTP (KTiOP04) member, for performing wavelength conversion in cooperation with a flat-plate microlens 16 is provided in resonators to obtain second harmonic laser beams (green light: 532 nm, in this case) in which a plurality of frequencies are doubled. A plurality of laser beams 14a to 14d can be obtained from one solid state laser medium 13 and one nonlinear optical element 19, that is, a plurality of laser beams 14a to 14d can be easily obtained at a low cost.

In Example 6, only KTP is provided in the laser resonators. However, a wavelength plate, a brewster window or the like may also be inserted to perform polarization control or output stabilization.

In each of Examples 1 to 6, a semiconductor laser device 11 having four emission points 1a to 11d is used. However, any semiconductor laser device having a plurality of emission points may be used. Also, the distance between emission points 11a to 11d is not limited to 0.5 mm, and it may be set to any value so long as the emission points are positioned in correspondence with the microlenses.

Example 7

Figure 11:
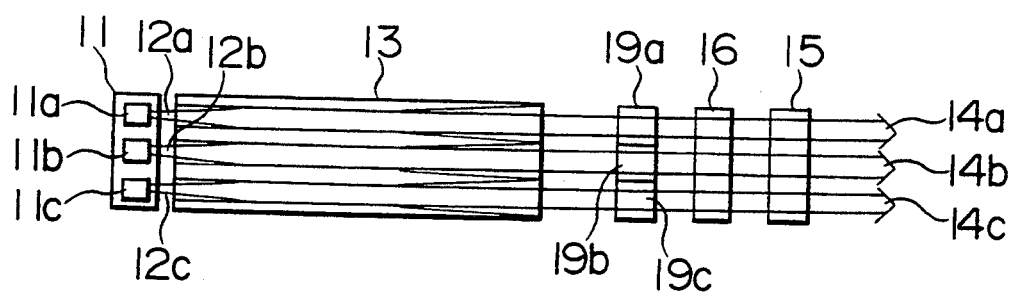
FIG. 11 is a schematic plan view of a semiconductor-laser-pumped solid-state laser apparatus in accordance with Example 7 of the present invention.

Examples 1 to 6 in which a plurality of laser beams 14a to 14d of the same wavelength is obtained have been described. It is also possible to obtain laser beams having different wavelengths from laser resonators. FIG. 11 shows an example of the semiconductor-laser-pumped solid-state laser apparatus of the present invention in which fundamental beams of three wavelengths of 946 nm, 1.064 μm, 1.319 μm oscillate by using a semiconductor laser device 11 having emission points 11a to 11c and a solid state laser medium 13 formed of Nd:YAG crystal, and second harmonic waves are generated by three non-linear optical elements 19a, 19b, and 19c provided in laser resonators, thereby obtaining laser beams 14a, 14b, 14c having three colors, i e., blue (473 nm), green (532 nm) and red (660 nm). A non-reflective coating with respect to the wavelength of 946 nm is formed on opposite end surfaces of the non-linear optical element 19a, a non-reflective coating with respect to the wavelength of 1.064 μm is formed on opposite end surfaces of the non-linear optical element 19b, and a nonreflective coating with respect to the wavelength of 1.319 μm is formed on opposite end surfaces of the non-linear optical element 19c. The fundamental wave of each wavelength selectively oscillates in the corresponding resonator, and the fundamental beams oscillated are wavelength-converted into laser beams having wavelengths of 473 nm, 532 nm, and 660 nm by the non-linear optical elements 19a, 19b, and 19c phase-matching with these wavelengths and are efficiently extracted out of the laser resonators by a selectively-transmissive coating formed on a partial reflection mirror 15.

Example 8

Figure 12:
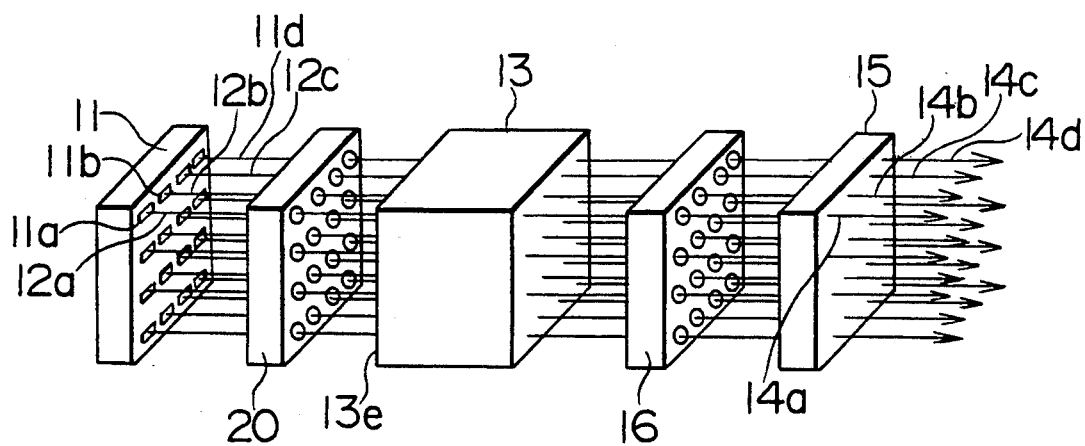
FIG. 12 is a schematic plan view of a semiconductor-laser-pumped solid-state laser apparatus in accordance with Example 8 of the present invention.

In the above-described Examples 1 to 7, a semiconductor laser device having a plurality of emission points 11a to 11d is used. However, it is possible to obtain a two-dimensionally-arranged semiconductor-laser-pumped solid-state laser device by combining a two-dimensional semiconductor laser array and a microlens array of a flat-plate microlenses or the like. An example of this type of laser apparatus illustrated in FIG. 12 has a semiconductor laser device 11 which has 4 × 4 emission points 11a, 11b, ... and which generates 16 pump light beams 12a, 12b, ..., and a solid state laser medium 13 having an pump light incidence end surface 13e on which a coating which is nonreflective with respect to pump light beams 12a, 12b, ... but is totally reflective with respect to laser beams 14a, 14b, ... is formed. This laser apparatus generates 16 laser beams 14a, 14b, .... This laser apparatus also has a partial reflection mirror 15, and a microlens array 16 formed of flat-plate microlenses or the like and having 16 lens components corresponding to laser beams 14a, 14b, .... The microlens array 16, the pump light incidence end surface 13e of the solid state laser medium 13 and the partial reflection mirror 15 form 16 laser resonators. Another microlens array 20 formed of flat-plate microlenses or the like is provided to convergently introduce pump light beams 12a, 12b, ... into the solid state laser medium 13. Pump light beams 12a, 12b, ... from the 16 semiconductor laser emission points 11a, 11b, ... are thereby converged on the optical axes of laser beams 14a, 14b, ....

By this arrangement, a semiconductor laser end-pumped solid state laser apparatus in the form of a two-dimensional array can be easily obtained by previously setting the distances between the emission points 11a, 11b, ... and the distances between the lenses of the flat-plate microlens array 20 in conformity with each other with accuracy. Also, a green laser apparatus in the form of a two-dimensional array, for example, can be obtained by using a non-linear optical element to effect wavelength conversion in resonators.

In Examples 1 to 8, as described above, a semiconductor laser device having a plurality of emission points on a straight line is adopted, light beams from this device are directly led to an end surface of a solid state laser medium in the form of a thin flat plate, and resonators are set in association with excitation regions. Consequently, a semiconductor laser end-pumped solid state laser apparatus capable of generating a plurality of light beams but small in size can be easily obtained by using one laser device.

It is also possible to easily obtain a two-dimensional array of laser beams through one solid state laser medium by adopting a semiconductor laser device having two-dimensionally-arranged emission points and a flat-plate microlens.

Example 9

Figure 13:
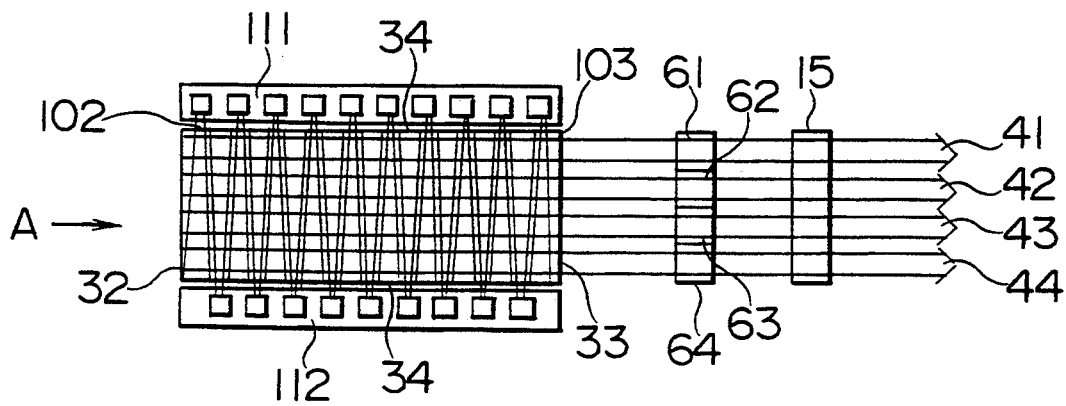
FIG. 13 is a schematic plan view of a semiconductor-laser-pumped solid-state laser apparatus in accordance with Example 9 of the present invention.
Figure 14:
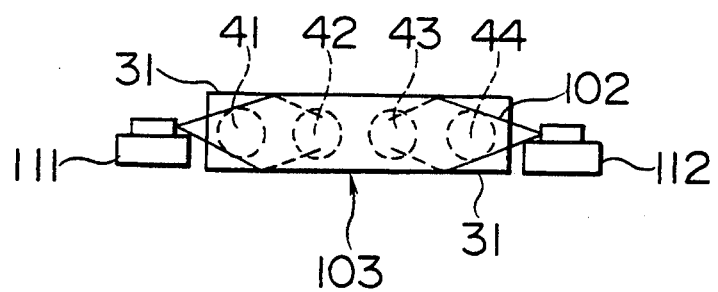
FIG. 14 is schematic longitudinal sectional view of the solid state laser medium of the laser apparatus shown in FIG. 13.

FIG. 13 is a schematic plan view of a semiconductor-laser-pumped solid-state laser apparatus in accordance with Example 9 of the present invention. As shown in FIG. 13, semiconductor laser devices 111 and 112 each capable of generating a plurality of pump light beams 102 have a group of 10 emission points and a group of 9 emission points, respectively, which groups of emission points are respectively arranged along straight lines, for example, at a pitch of 1 mm. A solid state laser medium 103 is formed of, for example, a Nd:YAG ($Y_{3-x}Nd_xAl_5O_{12}$) crystal having a length of 10 mm, a width of 5 mm and a thickness of 0.4 mm and having a rectangular cross-section. Laser beams 41, 42, 43, and 44 are output from the solid state laser medium 103. A coating which is totally reflective with respect to laser beams 41 to 44 is formed on one end surface 32 of the solid laser medium 103, while a coating which is non-reflective with respect to laser beams 41 to 44 is formed on the other end surface 33 of the solid state laser medium 103. A coating which is non-reflective with respect to pump light 102 is formed on side surfaces 34 of the solid state laser medium 103. Microlenses 61 to 64 are interposed between the solid state laser medium 103 and a partial reflection mirror 15 to form laser beams 41 to 44 into a certain shape.

The operation of this semiconductor-laser-pumped solid-state laser apparatus will be described below. Pump light beams 102 generated from the semiconductor laser devices 111, and 112 enter the solid state laser medium 103 through the side surfaces 34. Pump light beams 102 are repeatedly reflected in the solid state laser medium 103 by upper and lower surfaces 31 of the same and are absorbed by the solid state laser medium 103 while being confined in this medium. The solid state laser medium 103 is thereby pumped effectively. Stable laser resonators are formed between the solid state laser medium end surface 32 and the partial reflection mirror 15 as four independent resonators having excitation regions substantially having a size of about 0.5 × 0.5 mm by the effect of the microlenses 61 to 64. For example, if each of the solid state laser medium end surface 32 and the partial reflection mirror 15 is flat, the focal length of the microlenses 61 to 64 is 700 mm, and the length of the resonators is 15 mm, then four laser beams in a fundamental mode having a diameter of about 0.35 mm oscillate.

In the above-described Example 9, the microlenses may have different focal lengths with respect to the laser beams. In such a case, laser beams having different laser beam parameters can oscillate.

In Example 9, the number of emission points of the semiconductor laser devices 111 and 112 is 10 or 9, and four microlenses 61 to 64 and four laser beams 41 to 44 are provided. However, the number of emission points and the number of laser beams may be changed according to need.

Also, a one-dimensional flat-plate microlens may be used in place of a plurality of microlenses 61 to 64 used in Example 9. In this case, the microlens position setting is easier.

Further, while microlenses 61 to 64 constitute stabilized resonators in Example 9, a number of concave surfaces for local oscillation may be formed in the partial reflection mirror to form stabilized resonators without using the microlenses. The same effect as the above arrangement can be thereby obtained.

Example 10

Figure 15:
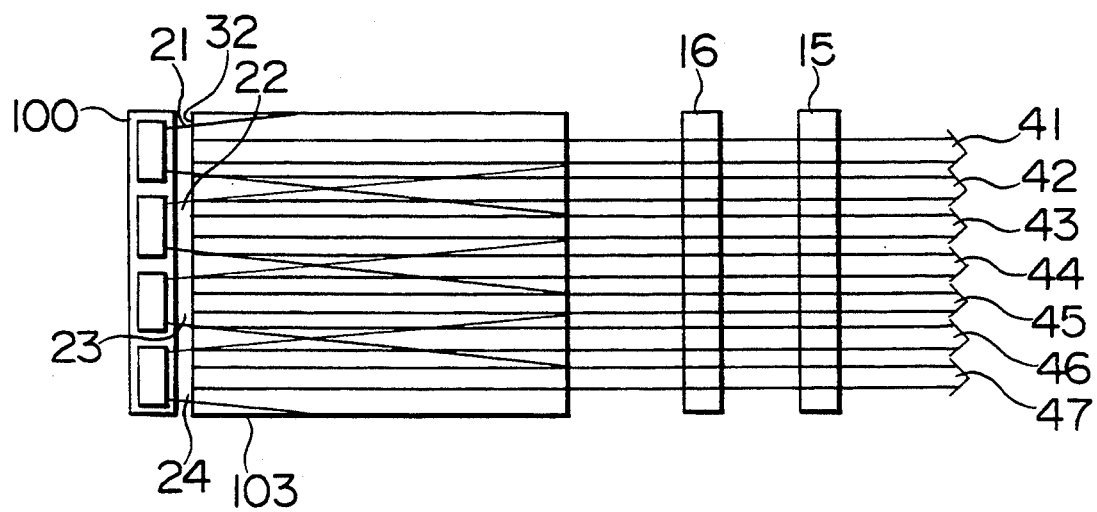
FIG. 15 is a schematic plan view of a semiconductor-laser-pumped solid-state laser apparatus in accordance with Example 10 of the present invention.

FIG. 15 shows an example of the semiconductor-laserpumped solid-state laser apparatus of the present invention in which four pump light beams 21 to 24 from a semiconductor laser device 100 enter the solid state laser medium 103 through an end surface 32 of the same, and 7 laser beams 41 to 47 oscillate by using a one-dimensional flat-plate microlens 16 having 7 elements. In this example, laser beams 41, 43, 45, and 47 are pumped only by pump light beams 21 to 24, respectively, while laser beams 42, 44, and 46 are pumped by pairs of pump light beams 21 and 22, 22 and 23, 23 and 24, respectively. In this example as well, the number of emission points of the semiconductor laser 100 and the number of laser beams can be set as desired.

Example 11

Figure 16:
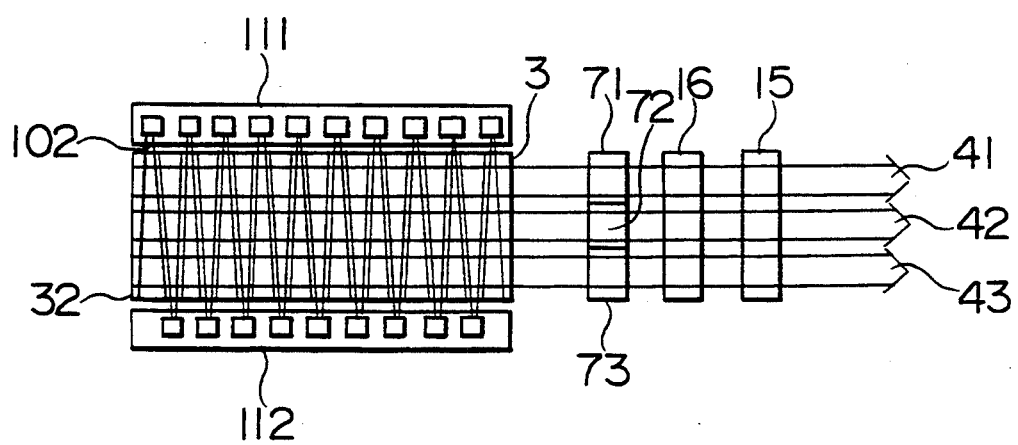
FIG. 16 is a schematic plan view of a semiconductor-laser-pumped solid-state laser apparatus in accordance with Example 11 of the present invention.

In the above-described Examples 9 and 10, a plurality of laser beams having the same wavelength are obtained. However, it is also possible to obtain laser beams having different wavelengths with respect to laser resonators. In this example, as shown in FIG. 16, three fundamental waves having wavelengths of 946 nm, 1.064 μm, and 1.319 μm oscillate, and second harmonic waves are generated by three non-linear optical elements 71, 72, and 73 provided in the resonators to perform wavelength conversion, thereby obtaining laser beams 41, 42, and 43 having three colors, i.e., blue (473 nm), green (532 nm) and red (660 nm). A non-reflective coating with respect to the wavelength of 946 nm is formed on opposite end surfaces of the non-linear optical element 71, a non-reflective coating with respect to the wavelength of 1.064 μm is formed on opposite end surfaces of the non-linear optical element 72, and a nonreflective coating with respect to the wavelength of 1.319 μm is formed on opposite end surfaces of the non-linear optical element 73. The fundamental wave of each wavelength selectively oscillates in the corresponding resonator, and the fundamental beams oscillated are wavelength-converted into laser beams having wavelengths of 473 nm, 532 nm, and 660 nm by the non-linear optical elements 71, 72, and 73 phase-matching with these wavelengths and are efficiently extracted out of the laser resonators by a selectively-transmissive coating formed on a partial reflection mirror 15.

Example 12

Figure 17:
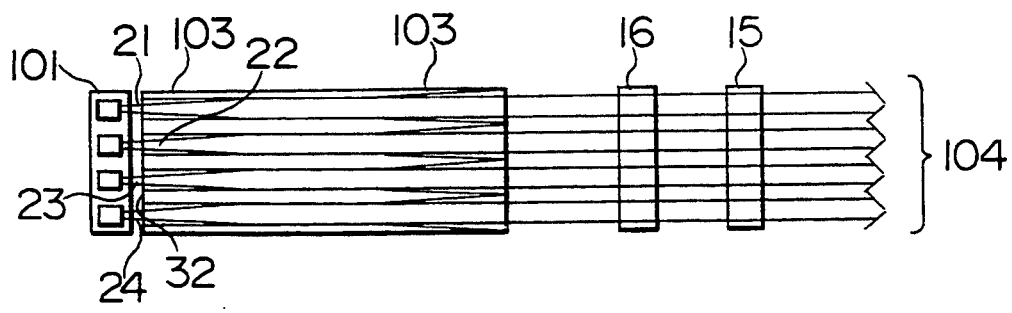
FIG. 17 is a schematic plan view of a semiconductor-laser-pumped solid-state laser apparatus in accordance with Example 12 of the present invention.
Figure 18:
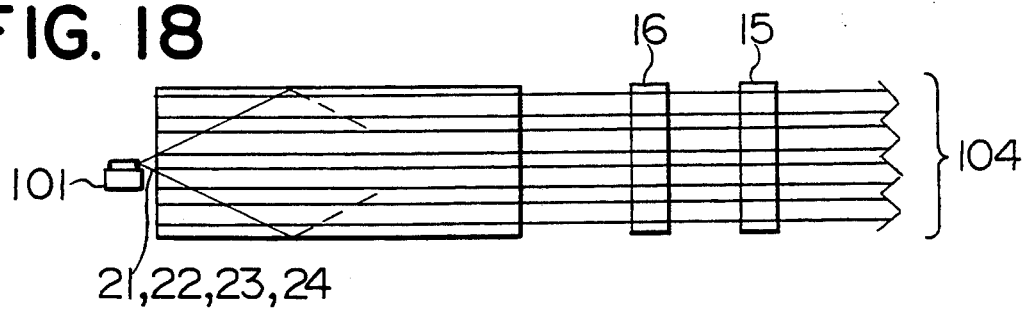
FIG. 18 is a schematic side view of the laser apparatus shown in FIG. 17.
Figure 19:
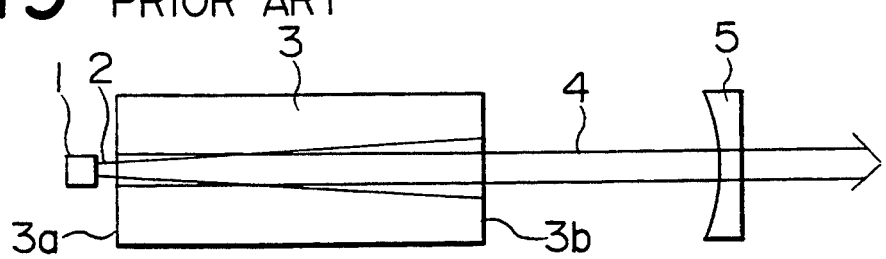
FIG. 19 is a schematic plan view of a conventional semiconductor-laser-pumped solid--state laser apparatus.
Figure 20:
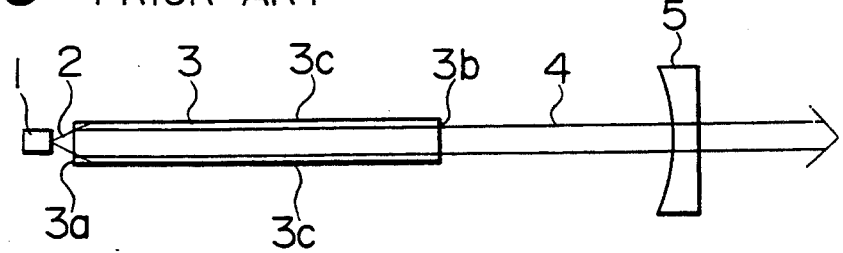
FIG. 20 is a schematic side view of the conventional semiconductor-laser-pumped solid-state laser apparatus.

In the above-described Examples 9 to 11, a plurality of laser beams arranged on a straight light are obtained. However, it is possible to obtain a two dimensional array of laser beams by using a two-dimensional array of a flat-plate microlenses, as shown in FIGS. 17 and 18. In Example 12 shown in FIGS. 17 and 18, a semiconductor laser device 100 having four emission points generate four pump light beams 21 to 24. A solid state laser medium 103 has, for example, the shape of a rectangular prism having a square cross section. A coating which is non-reflective with respect to pump light beams 21 to 24 but is totally reflective with respect to laser beams 104 is formed on an pump light incidence end surface 32 of the solid state laser medium 103. A microlens array 16 of flat-plate microlenses or the like is provided which has 16 lens components corresponding to 16 laser beams 104. The microlens array 16, the pump light incidence end surface 32 of the solid state laser medium 103, and a partial reflection mirror 15 form 16 laser resonators.

In ordinary semiconductor lasers, the opening angle in a direction perpendicular to the active layer is greater than that in a horizontal direction. Therefore, if emission points are arranged in a row in the horizontal direction as shown in FIG. 17, the regions respectively pumped by the emission points range to an extent large enough to pump a plurality of laser beams (four laser beams in the illustrated example) arranged in the vertical direction. Accordingly, a semiconductor end surface excitation solid state laser apparatus in the form of a two-dimensional array can be easily obtained by the above-described arrangement. Also, a green laser apparatus in the form of a two-dimensional array, for example, can be obtained by using a non-linear optical element to effect wavelength conversion in resonators.

In Examples 9 to 12, as described above, light beams from a semiconductor laser device are introduced into a solid state laser medium, and the same number of laser beams as a number of microlenses are formed in one solid state laser medium by the microlenses. Consequently, a semiconductor laser end-pumped solid state laser apparatus capable of generating a plurality of light beams but small in size can be easily obtained by using one solid state laser medium.

It is also possible to obtain a two-dimensional array of laser beams by using a two-dimensional array of microlenses.

What is claimed is:

1. A semiconductor-laser-pumped solid-state laser apparatus comprising:
   a semiconductor laser device for generating pump light;
   a solid state thin plate laser medium pumped by the pump light disposed adjacent to said semiconductor laser device, said laser medium efficiently confining the pump light therein by repeated reflection of the pump light on both an upper and lower surface of said laser medium; and
   laser resonator means having a pair of reflecting surfaces facing each other with said solid state laser medium interposed therebetween, said laser resonator means being for emitting a plurality of laser light beams;
   wherein said semiconductor laser device has a plurality of emission points which are arranged on a straight line and from which the pump light is generated, and said laser resonator means is disposed in correspondence with the emission points such that said plurality of laser light beams are emitted.

2. A laser apparatus according to claim 1 further comprising a microlens disposed so as to receive said laser light beams emitted by said laser resonator means for forming the laser light into a predetermined shape.

3. A laser apparatus according to claim 1 further comprising a two-dimensional array of microlenses for emitting a plurality of beams of the laser light, said microlenses being provided in said laser resonator means to generate a two-dimensional array of laser beams.

4. A laser apparatus according to claim 1 further comprising a non-linear optical element provided in said laser resonator means to perform wavelength conversion.

5. A laser apparatus according to claim 1 wherein said semiconductor laser device has a plurality of emission points arranged two dimensionally, the pump light from each emission point being emitted and converged to said solid state laser medium through a microlens array arranged two-dimensionally.

6. The laser according to claim 1 wherein said pair of reflecting surfaces comprise a pair of reflecting mirrors.

7. The laser according to claim 1 wherein said pair of reflecting surfaces comprise a pair of surfaces having reflecting coatings.

8. A semiconductor-laser-pumped solid-state laser apparatus comprising:
   a semiconductor laser device for generating pump light;
   a solid state thin plate laser medium in which the pump light is confined by internal reflection and which is pumped by the pump light; and
   laser resonator means having a pair of reflecting surfaces facing each other with said solid state laser medium interposed therebetween, said laser resonator means being for emitting a plurality of beams of laser at a laser beam emitting said thereof;
   said laser resonator means further having at least one microlens disposed in an output path of a respective one of said plurality of beams of laser light.

9. A laser apparatus according to claim 8 further comprising a non-linear optical element provided in said laser resonator means to perform wavelength conversion.

10. The laser according to claim 8 wherein said pair of reflecting surfaces comprise a pair of reflecting mirrors.

11. The laser according to claim 8 wherein said pair of reflecting surfaces comprise a pair of surfaces having reflecting coatings.

* * * * *